United States Patent
Zhu

(10) Patent No.: US 10,593,242 B2
(45) Date of Patent: Mar. 17, 2020

(54) DETECTION METHOD AND DETECTION DEVICE OF DISPLAY PANEL

(71) Applicant: BOE TECHNOLOGY GROUP CO., LTD., Beijing (CN)

(72) Inventor: Mingyi Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 92 days.

(21) Appl. No.: 15/861,130

(22) Filed: Jan. 3, 2018

(65) Prior Publication Data
US 2018/0330649 A1 Nov. 15, 2018

(30) Foreign Application Priority Data
May 12, 2017 (CN) .......................... 2017 1 0335020

(51) Int. Cl.
*G01R 31/00* (2006.01)
*G09G 3/00* (2006.01)
(Continued)

(52) U.S. Cl.
CPC .............. *G09G 3/006* (2013.01); *G09G 3/32* (2013.01); *H01L 27/3248* (2013.01); *H01L 27/3276* (2013.01); *G09G 2320/0295* (2013.01)

(58) Field of Classification Search
CPC ................. G09G 3/006; G09G 3/3233; G09G 2320/0295; G09G 2320/043; G09G 2320/0233; G09G 2330/12; G09G 3/3266; G09G 2330/10; G09G 3/3225; G09G 3/3291; G09G 3/3208; G09G 2320/029; G09G 3/3258; G09G 2320/0223; G09G 2320/0242; G09G 3/3648; G09G 2300/043; G09G 2330/02; G09G 3/2003; G09G 3/2007; G09G 2330/022; G09G 2330/028;
(Continued)

(56) References Cited

U.S. PATENT DOCUMENTS 8,199,074 B2 6/2012 Wang et al.
8,199,078 B2 6/2012 Handa et al.
(Continued)

FOREIGN PATENT DOCUMENTS

CN 101123066 A 2/2008
CN 101210890 A 7/2008
(Continued)

OTHER PUBLICATIONS

Office Action dated Oct. 28, 2019 issued in corresponding Chinese Application No. 201710335020.8.

*Primary Examiner* — Vinh P Nguyen
(74) *Attorney, Agent, or Firm* — Nath, Goldberg & Meyer; Joshua B. Goldberg; Daniel J. Bissing

(57) ABSTRACT

A detection method and a detection device of a display pane are provided. The detection method includes: detecting an actual value of an electric signal at a first electrode of a driving transistor in each of pixel units when the display panel reaches target brightness, the electric signal including a current signal and/or a voltage signal; and determining according to the actual value of the electrical signal corresponding to each of the pixel units, whether each of the pixel units is defective. The present disclosure may help an operator determine if each of the pixel units is defective quickly.

18 Claims, 5 Drawing Sheets

(51) Int. Cl.
*H01L 27/32* (2006.01)
*G09G 3/32* (2016.01)

(58) Field of Classification Search
CPC .............. G09G 3/2085; G02F 1/13454; G02F 2201/123; G02F 2201/50; G01R 31/11; G01R 31/31728; G01R 31/2635; G01R 31/2818; G01R 31/308; G06F 3/041; G06F 3/0412
See application file for complete search history.

(56) References Cited

U.S. PATENT DOCUMENTS

| | | | |
|---|---|---|---|
| 9,361,820 B2 * | 6/2016 | Lee | .................. G09G 3/006 |
| 9,378,678 B1 * | 6/2016 | Lee | .................. G09G 3/2003 |
| 9,536,460 B2 * | 1/2017 | Chaji | .................. G09G 3/00 |
| 9,601,058 B2 | 3/2017 | Lee et al. | |
| 9,940,861 B2 | 4/2018 | Chaji et al. | |
| 10,297,200 B2 | 5/2019 | Kim et al. | |
| 2005/0093567 A1 * | 5/2005 | Nara | .................. G09G 3/006 |
| | | | 324/762.09 |
| 2014/0347332 A1 | 11/2014 | Lee | |
| 2017/0067957 A1 | 3/2017 | Lee | |

FOREIGN PATENT DOCUMENTS

| | | |
|---|---|---|
| CN | 101645237 A | 2/2010 |
| CN | 104335270 A | 2/2015 |
| CN | 105761673 A | 7/2016 |
| CN | 106328027 A | 1/2017 |

\* cited by examiner

DETECTION METHOD AND DETECTION DEVICE OF DISPLAY PANEL

CROSS-REFERENCE TO RELATED APPLICATIONS

The present disclosure claims the priority of Chinese Patent Application No. 201710335020.8, filed on May 12, 2017, the contents of which are incorporated herein by reference in its entirety.

TECHNICAL FIELD

The present disclosure relates to the field of display technology, and in particular, to a detection method and a detection device of a display panel.

BACKGROUND

Organic light-emitting devices (OLEDs) have been widely used in display devices due to their advantages such as active emission, good temperature characteristics, low power consumption, fast response, wide viewing angle, ultra-thin and low cost.

SUMMARY

The present disclosure provides a detection method and detection device of a display panel.

In an aspect of the disclosure, a detection method of a display panel is provided, the display panel includes a plurality of pixel units, each of the plurality of pixel units includes a light emitting diode and a pixel circuit for driving the light emitting diode, the pixel circuit includes a driving transistor with a first electrode of the driving transistor connected to the light emitting diode, the detection method includes steps of: detecting, by a detector, an actual value of an electric signal at the first electrode of the driving transistor in each of the plurality of pixel units when the display panel reaches target brightness, and determining, by an analyzer, according to the actual value of the electrical signal corresponding to each of the plurality of pixel units, whether each of the plurality of pixel units is defective.

Optionally, the analyzer includes a calculating device, a comparator and a first determination device, and the step of determining, by an analyzer, according to the actual value of the electrical signal corresponding to each of the plurality of pixel units, whether each of the plurality of pixel units is defective includes steps of: calculating, by the calculating device, a difference between a standard value and the actual value of the electric signal corresponding to each of the plurality of pixel units; comparing, by the comparator, a predetermined value with the difference corresponding to each of the plurality of pixel units; and determining, by the first determination device, a pixel unit corresponding to the difference as a defective pixel unit when the difference is greater than the predetermined value, and determining a defect type of the defective pixel unit according to a correspondence between each of a plurality of defect types and a respective one of difference ranges.

Optionally, the standard value is an average value of the actual values of the electrical signals corresponding to the plurality of pixel units of the display panel.

Optionally, after the step of determining, by the first determination device, a pixel unit corresponding to the difference as a defective pixel unit when the difference is greater than the predetermined value, and determining a defect type of the defective pixel unit according to a correspondence between each of the plurality of defect types and a respective one of difference ranges, the detection method further includes: counting a number of pixel units belonging to each of the plurality of defect types by a statistic calculator, and outputting statistics result.

Optionally, the analyzer includes an image generator, an image processor, and a second determination device, and the step of determining, by an analyzer, according to the actual value of the electrical signal corresponding to each of the plurality of pixel units, whether each of the plurality of pixel units is defective includes steps of: generating a reference image by the image generator, the reference image comprising a plurality of pixel points having a one-to-one correspondence to the plurality of pixel units of the display panel, a grayscale of each of the plurality of pixel points being positive correlated with the actual value of the electrical signal at the first electrode of the driving transistor in the respective one of the plurality of pixel units; performing histogram normalization on the reference image by the image processor; and determining, by the second determination device, whether each of the plurality of pixel units is defective according to a histogram normalized reference image.

Optionally, before the step of detecting, by a detector, an actual value of an electric signal at the first electrode of the driving transistor in each of the plurality of pixel units when the display panel reaches target brightness, the detection method further includes steps of: obtaining, by a theoretical data obtaining device, a theoretical data voltage of each of the plurality of pixel units according to the target brightness; obtaining, by a threshold obtaining device, a threshold voltage of the driving transistor in each of the plurality of pixel units; calculating, by a target data obtaining device, a sum of the threshold voltage of the driving transistor in each of the plurality of pixel units and the theoretical data voltage of the pixel unit, as a target data voltage corresponding to the pixel unit; and providing, by a data driver, each of the plurality of pixel units with a respective target data voltage so that the display panel reaches the target brightness.

Optionally, the step of obtaining, by a theoretical data obtaining device, a theoretical data voltage of each of the plurality of pixel units according to the target brightness includes: obtaining, by the theoretical data obtaining device, a target grayscale according to the target brightness; and determining the theoretical data voltage corresponding to the target grayscale according to a correspondence between a grayscale and a data voltage.

Optionally, the step of obtaining, by a threshold obtaining device, a threshold voltage of the driving transistor in each of the plurality of pixel units includes: providing, by the data driver, an initial data voltage to the plurality of pixel units of the display panel so that the display panel reaches a full dark state; and obtaining, by the threshold value obtaining device, a voltage at the first electrode of the driving transistor in each of the plurality of pixel units as the threshold voltage of the driving transistor.

Optionally, each of the plurality of pixel units further includes a detection transistor and a detection capacitor, and a first electrode of the detection transistor is connected to the first electrode of the driving transistor, a control electrode of the detection transistor is connected to a control signal line, a second electrode of the detection transistor is connected to a first terminal of the detection capacitor, and a second terminal of the detection capacitor is connected to a detection signal line, and wherein when the display panel reaches the target brightness, the detection transistor is turned on under the control of the control signal line, and the detector detects a voltage across the detection capacitor as the actual value of the electrical signal at the first electrode of the driving transistor.

Optionally, each of the plurality of pixel units further includes a detection transistor and a detection capacitor, and a first electrode of the detection transistor is connected to the first electrode of the driving transistor, a control electrode of the detection transistor is connected to a control signal line, a second electrode of the detection transistor is connected to a first terminal of the detection capacitor, and a second terminal of the detection capacitor is connected to a detection signal line, and wherein when the display panel reaches the full dark state, the detection transistor is turned on under the control of the control signal line, and the detector detects a voltage across the detection capacitor as the threshold voltage of the driving transistor.

In another aspect of the disclosure, a detection device of a display panel is provided, the display panel includes a plurality of pixel units, each of the plurality of pixel units includes a light emitting diode and a pixel circuit for driving the light emitting diode, the pixel circuit includes a driving transistor with a first electrode of the driving transistor connected to the light emitting diode, and the detection device includes: a detector, configured to detect an actual value of an electric signal at the first electrode of the driving transistor in each of the plurality of pixel units when the display panel reaches target brightness, and an analyzer, configured to determine, according to the actual value of the electrical signal corresponding to each of the plurality of pixel units, whether each of the plurality of pixel units is defective.

Optionally, the analyzer includes: a calculating device, configured to calculate a difference between a standard value and the actual value of the electric signal corresponding to each of the plurality of pixel units; a comparator, configured to compare a predetermined value with the difference corresponding to each of the plurality of pixel units; and a first determination device, configured to determine a pixel unit corresponding to the difference as a defective pixel unit when the difference is greater than the predetermined value, and to determine a defect type of the defective pixel unit according to a correspondence between each of a plurality of defect types and a respective one of difference ranges.

Optionally, the standard value is an average value of the actual values of the electrical signals corresponding to the plurality of pixel units of the display panel.

Optionally, the detection device further includes: a statistic calculator, configured to count a number of pixel units belonging to each of the plurality of defect types according to determination result of the analyzer, and to output statistics result.

Optionally, the analyzer includes: an image generator, configured to generate a reference image, the reference image comprising a plurality of pixel points having a one-to-one correspondence to the plurality of pixel units of the display panel, a grayscale of each of plurality of pixel points being positive correlated with the actual value of the electrical signal at the first electrode of the driving transistor in the respective one of the plurality of pixel units; an image processor, configured to perform a histogram normalization on the reference image; and a second determination device, configured to determine whether each of the plurality of pixel units is defective according to a histogram normalized reference image.

Optionally, the detection device further includes: a theoretical data obtaining device, configured to obtain a theoretical data voltage of each of the plurality of pixel units according to the target brightness; a threshold obtaining device, configured to obtain a threshold voltage of the driving transistor in each of the plurality of pixel units; a target data obtaining device, configured to calculate a sum of the threshold voltage of the driving transistor in each of the plurality of pixel units and the theoretical data voltage of the pixel unit, as a target data voltage of the pixel unit; and a data driver, configured to provide each of the plurality of pixel units with a respective target data voltage so that the display panel reaches the target brightness.

Optionally, the theoretical data obtaining device is configured to obtain a target grayscale according to the target brightness; and to determine the theoretical data voltage corresponding to the target grayscale according to a correspondence between a grayscale and a data voltage.

Optionally, the data driver is configured to provide an initial data voltage to the plurality of pixel units of the display panel so that the display panel reaches a full dark state; the detector is configured to detect a voltage at the first electrode of the driving transistor in each of the plurality of pixel units when the display panel reaches the full dark state; and the threshold value obtaining device is configured to obtain the voltage at the first electrode of the driving transistor in each of the plurality of pixel units when the display panel reaches the full dark state, as the threshold voltage of the driving transistor.

Optionally, each of the plurality of pixel units further includes a detection transistor and a detection capacitor, and a first electrode of the detection transistor is connected to the first electrode of the driving transistor, a control electrode of the detection transistor is connected to a control signal line, a second electrode of the detection transistor is connected to a first terminal of the detection capacitor, and a second terminal of the detection capacitor is connected to a detection signal line, and wherein when the display panel reaches the target brightness, the detection transistor is turned on under the control of the control signal line, and the detector detects a voltage across the detection capacitor as the actual value of the electrical signal at the first electrode of the driving transistor.

Optionally, each of the plurality of pixel units further includes a detection transistor and a detection capacitor, and a first electrode of the detection transistor is connected to the first electrode of the driving transistor, a control electrode of the detection transistor is connected to a control signal line, a second electrode of the detection transistor is connected to a first terminal of the detection capacitor, and a second terminal of the detection capacitor is connected to a detection signal line, and wherein when the display panel reaches the full dark state, the detection transistor is turned on under the control of the control signal line, and the detector detects a voltage across the detection capacitor as the threshold voltage of the driving transistor.

BRIEF DESCRIPTION OF THE DRAWINGS

The accompanying drawings, which provide a further understanding of the disclosure and constitute a part of the specification, are used in conjunction with the following specific embodiments to explain the disclosure, but are not intended to limit the disclosure. In the drawings.

DETAILED DESCRIPTION

Specific embodiments of the present disclosure are described in detail below with reference to the accompanying drawings. It should be understood that the specific embodiments described herein are only used for describing and explaining the disclosure, but not for limiting the disclosure.

An organic electroluminescent display panel includes a plurality of pixel units, and a light-emitting diode (LED) and a pixel driving circuit for driving the light-emitting diode are provided in each of the pixel units. During display, a magnitude of a current applied to the LED is affected by a threshold voltage of a driving thin film transistor (TFT) connected to the LED. Because the threshold voltage and a mobility of a driving TFT in one pixel unit are different from those of a driving TFT in another pixel unit, the current applied to an LED in one pixel unit is different from that applied to an LED in another pixel unit, whereby reducing the display brightness uniformity of the display panel, resulting in display defects such as spots in the area. It is desirable to quickly determine whether a pixel unit has a defect.

Figure 1A:
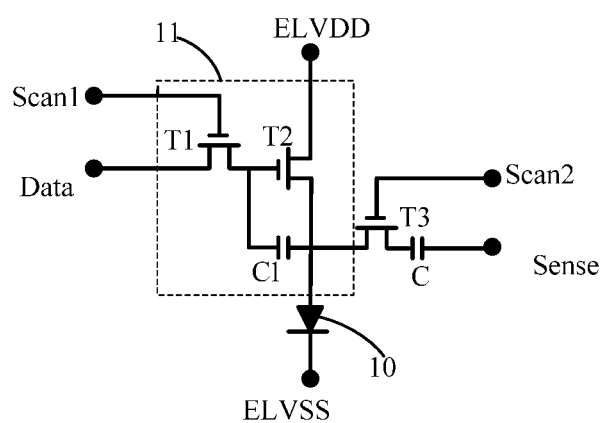
FIG. 1a is a structural schematic diagram of a pixel unit in a display panel under test.

FIG. 1a shows a structural schematic diagram of each of a plurality of pixel units in a display panel under test in the present disclosure. As shown in FIG. 1a, each pixel unit includes a light-emitting diode 10 and a pixel circuit 11 for driving the light-emitting diode 10. The pixel circuit 11 includes a write transistor T1, a driving transistor T2, and a storage capacitor C1. The gate of the write transistor T1 is connected to the gate line Scan1 corresponding to the pixel unit. The first electrode of the write transistor T1 is connected to the data line Data corresponding to the pixel unit, and the second electrode of the write transistor T1 is connected to a gate of the driving transistor T2 and a first terminal of the storage capacitor C1. The driving transistor T2 provides a driving current for the LED 10. A first electrode of the driving transistor T2 is connected to a second terminal of the storage capacitor C1 and an anode of the LED 10, the connection may be direct connection or indirect connection, for example, another transistor is disposed between the first electrode of the driving transistor T2 and the light emitting diode 10. A second electrode of the driving transistor T2 is connected to the power supply terminal ELVDD; and the gate of the driving transistor T2 receives a data signal from the data line Data, and controls the light-emitting diode to emit light according to the data signal. A cathode of the light emitting transistor 10 is connected to the low level signal terminal ELVSS. Each pixel unit further includes a detection transistor T3. A gate of the detection transistor T3 is connected to the control signal line Scan2. A first electrode of the detection transistor T3 is connected to the first electrode of the driving transistor T2. A second electrode of the detection transistor T3 is connected to a detection signal line Sense. Each detection signal line Sense may also be connect in series with a detection capacitor C.

Figure 1B:
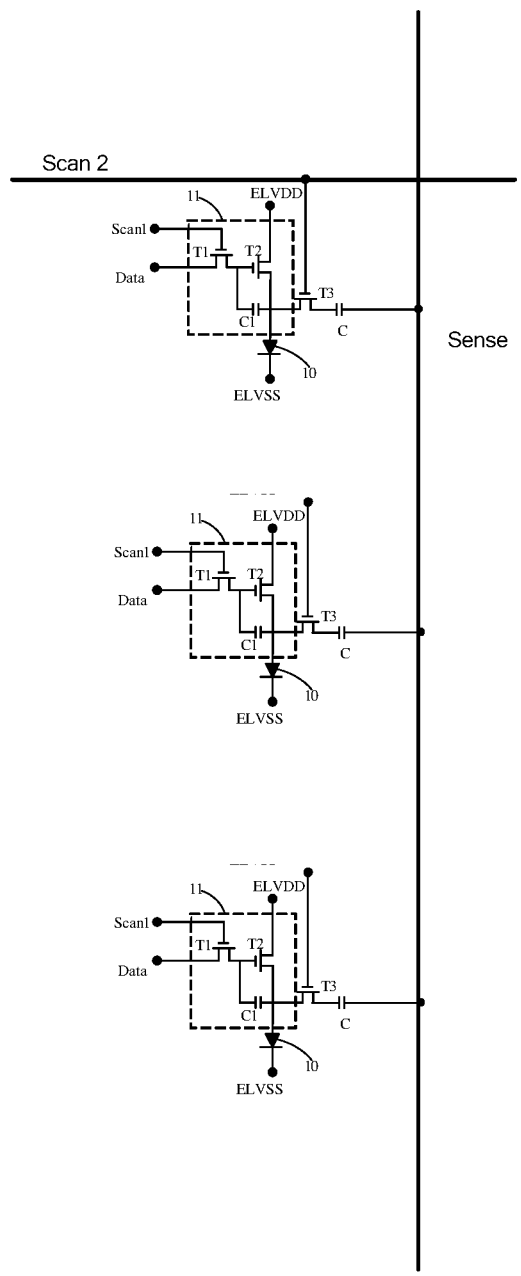
FIG. 1b is a schematic diagram illustrating a configuration of a plurality of pixel units in the display panel.

FIG. 1b is a schematic diagram illustrating a configuration of a plurality of pixel units in a display panel. As shown in FIG. 1b, the gate of each of detection transistors T3 in the same row is connected to the same control signal line Scan2, and the second electrode of each of the detection transistors T3 in the same column is connected to the same detection signal line Sense. Only some signal lines are shown in FIG. 1b, other lines are omitted.

Figure 2:
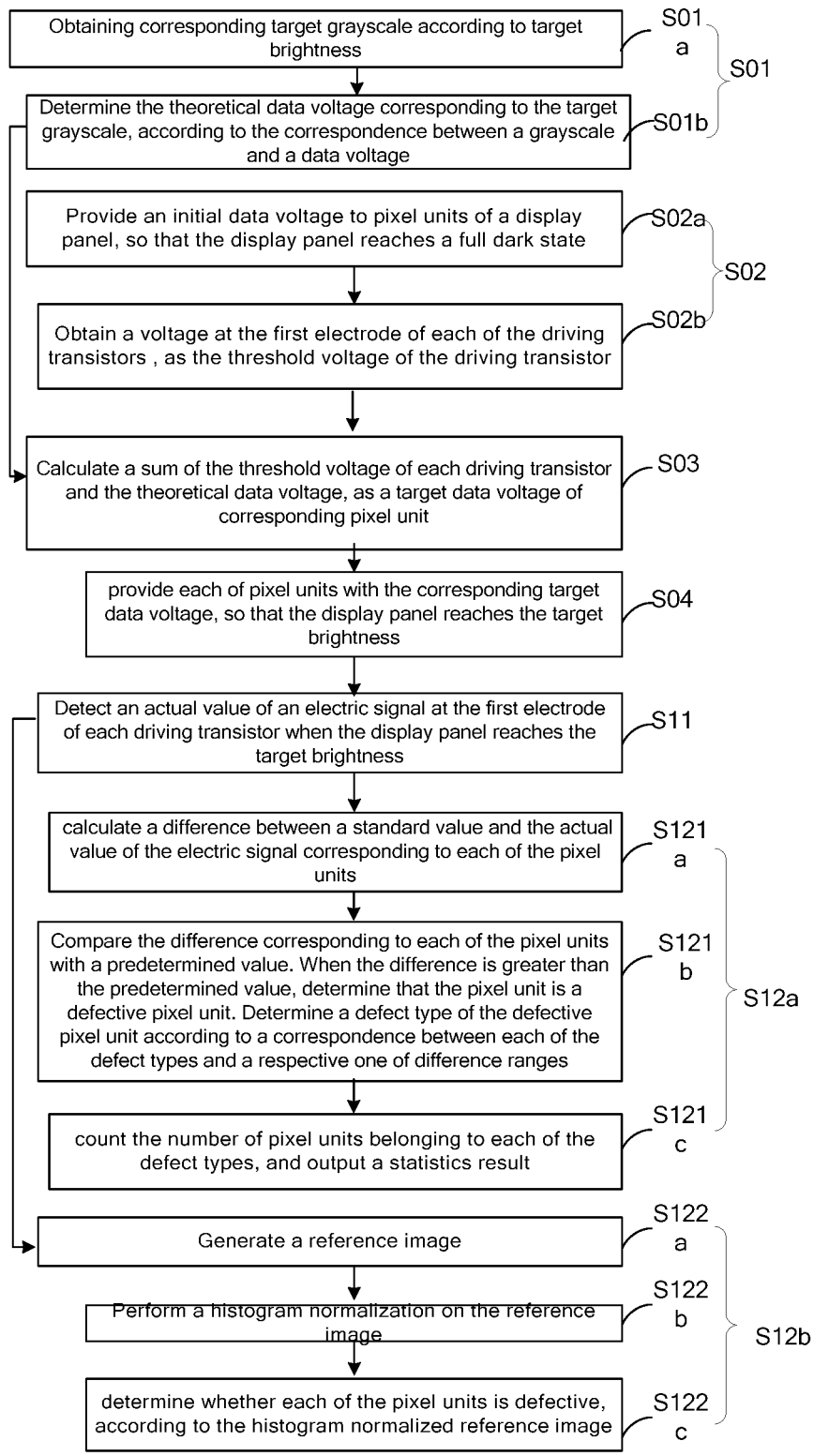
FIG. 2 is a flowchart of a method for detecting a display panel according to an embodiment of the present disclosure.

FIG. 2 is a flowchart of a method for detecting a display panel according to an embodiment of the present disclosure. As shown in FIG. 2, the detection method includes a step S11 and a step S12.

In the step S11, an actual value of an electrical signal at the first electrode of the driving transistor T2 in each pixel unit when the display panel reaches target brightness is detected by a detector. The electrical signal includes a voltage signal and/or a current signal.

In the step S12, it is determined whether a pixel unit is defective by an analyzer according to the actual value of the electrical signal corresponding to the pixel unit. Other pixel units except for this pixel unit may be detected in the same way, so as to determine whether each of the pixel units is defective.

When a pixel unit displays preset brightness, the value of the electrical signal at the first electrode of the driving transistor T2 in the pixel unit is a predetermined value which is recorded as a standard value. If the pixel unit is normal, that is, if the pixel unit has no defect. There is a large difference between the standard value and an actual value of the electric signal at the first electrode of the driving transistor T2 in the pixel unit, if the pixel unit is abnormal. Therefore, in the step S12, it may be determined whether each pixel unit is defective according to the determination whether there is a large difference between the standard value and the actual value of the electric signal corresponding to the pixel unit. Optionally, other methods may also be used.

In the detection method of the present disclosure, since it is determined whether a pixel unit is defective according to the actual value of the electric signal at the first electrode of the driving transistor T2 in the pixel unit, during a batch detection process it is possible to determine whether each pixel unit is defective according to the electric signal corresponding each pixel unit by providing the display panel with a driving voltage required for the target brightness, so as to eliminate the need for artificially analyzing a display image of the display panel, which improves detection efficiency and production yield.

Specifically, step S12 may include: a step S121a and a step S121b.

In the step S121a, the difference between the standard value and the actual value of the electric signal corresponding to the pixel unit is calculated by a calculating device.

In the step S121b, a predetermined value and the difference corresponding to the pixel unit are compared by a comparator.

When the difference is greater than the predetermined value, a first determination device determines that the pixel unit corresponding to the difference is a defective pixel unit and determines a defect type of the defective pixel unit according to a correspondence between each of a plurality of defect types and a respective one of difference ranges. There may be many defect types such as short circuit, open circuit, etc. Because the defects of the pixel units in display panel may be different from each other, the differences corresponding to the pixel units may be different from each other. As described above, if a pixel unit is normal, the value of the electrical signal at the first electrode of the driving transistor T2 in the pixel unit is a predetermined value. If a pixel unit has defects such as short circuit, open circuit, etc., there will be a significant difference between the standard value and the actual value of the electrical signal at the first electrode of the driving transistor T2 in the defective pixel unit. Different defect types result in different differences. Specifically, if a short circuit occurs in the pixel unit, the voltage at the first electrode of the driving transistor T2 is substantially the same as a voltage of the power supply terminal ELVDD. If an open circuit occurs in the pixel unit, the voltage at the first electrode of the driving transistor T2 is substantially zero. Therefore, a defect type of the pixel unit may be easily determined according to the actual value of the voltage signal at the first electrode of the driving transistor T2.

The above standard value and difference ranges corresponding to the plurality of defect types may be set in advance. For example, before the batch detection, a driving signal corresponding to the target brightness may be provided to a plurality of normal pixel units and to each of defective pixel units whose defect type is known. Then, the magnitude (i.e., the standard value) of the electrical signals at the first electrodes of the driving transistors T2 in the normal pixel units are the same and detected, and the magnitude (i.e., actual values) of the electrical signals at the first electrodes of the driving transistors T2 in defective pixel units are different from each other and detected respectively. Thus, a range of the difference between the standard value and the actual value of the electrical signal of each of defective pixel units which has the known defect type is obtained as the difference range corresponding to the known defect type. Other difference ranges corresponding to other known defect types may be obtained in the same way. Considering actual production, the proportion of defective pixel units in the entire display panel is very small. Therefore, in the present disclosure, the standard value is set as an average value of the actual values of the electrical signals corresponding to the pixel units detected in step S11.

Therefore, during batch detection, it is possible to determine quickly the defect the display panel has by detecting the actual value of the electric signal at the first electrode of the driving transistor T2, obtaining the difference between the actual value and the standard value, and determining the defect corresponding to a difference range that the difference belongs to.

Alternatively, the step S12 may include a step S122a, a step S122b and a step 122c.

A reference image is generated by an image generator (step S122a). Each of pixel points in the reference image has a one-to-one correspondence to a respective one of the pixel units in the display panel, and a grayscale of each pixel point is positive correlated with the actual value of the electrical signal at the first electrode of the driving transistor in the respective one of the pixel units; and then, a histogram normalization is performed on the reference image and the histogram normalized reference image is displayed by an image processor (step S122b), so that an operator may visually see a position of the defective pixel unit (step 122c). These steps will be explained in detail.

In addition to the above detection process, the detection method of the display panel may further include a compensation process for compensating the threshold voltage of the driving transistor T2 to prevent the different threshold voltages of different driving transistors T2 from affecting a detection result.

First, as shown in FIG. 2, the compensation process includes a step S01, a step S02, a step S03 and a step S04.

In step S01, a theoretical data voltage is obtained according to the target brightness by a theoretical data voltage obtaining device. The theoretical data voltage may refer to a data voltage required to be provided to the normal pixel units (i.e., a data voltage provided to a data line corresponding to the normal pixel units) such that the normal pixel units reach the target brightness. The step S01 may include a step S01a and a step S01b.

In step S01a, a target grayscale is obtained according to the target brightness by the theoretical data voltage obtaining device. In general, the relationship between the brightness and the grayscale displayed by the display panel conforms to the following formula (1):

$$L_z = K \times z^m \tag{1}$$

Where $L_z$ represents the brightness of the $z^{th}$ grayscale, z represents the $z^{th}$ grayscale, K represents a constant determined by the display panel, and m represents the gamma value of the display panel, that is, the $z^{th}$ grayscale has one-to-one correspondence to the brightness of the $z^{th}$ grayscale. When the gamma value of the display panel is known, the target grayscale may be determined according to the above formula (1). To prevent the display panel's gamma value from varying during display, the gamma value may be adjusted at first. Specifically, firstly, various kinds of sample brightness such as maximum brightness (L max), intermediate brightness (L max/4), a full dark state, and the like, may be set; secondly, data voltages are then provided to the pixel units so that the display panel reaches the various kinds of sample brightness, respectively; thirdly, actual grayscales each corresponding to each of the kinds of sample brightness are obtained according to the correspondence between a data voltage and a grayscales; and then the gamma value of the display panel is adjusted according to a correspondence between each of the kinds of sample brightness and respective one of the actual grayscales.

In step S01b, the theoretical data voltage corresponding to the target grayscale is determined by the theoretical data voltage obtaining device, according to the correspondence between the grayscale and the data voltage. The grayscale is linear with the data voltage, and the linearity relationship may be obtained according to a data voltage range provided to the display panel and a grayscale range. For example, if the grayscale range is from 0 to 255 and the data voltage range is from 0 to 10V, the grayscale 0 corresponds to the data voltage 0V, and the grayscale 255 corresponds to the data voltage 10V, so that the linearity relationship between the grayscale and the data voltage may be obtained.

In step S02, the threshold voltage of the driving transistor T2 in each pixel unit is obtained by a threshold obtaining device. The step S02 may include a step S02a and a step S02b.

In the step S02a, an initial data voltage is provided by a data driver to pixel units of the display panel, so that the display panel reaches a full dark state. In order to enable the display panel to reach the full dark state, a data voltage corresponding to the full dark state may be obtained according to the relationship between the brightness and the grayscale and the relationship between the grayscale and the data voltage. In practical applications, in order to enable the display panel to reach the full dark state more accurately, first a data voltage may be provided to pixel units, so that the brightness of the display panel is slightly greater than zero. Then, the data voltage for the pixel units is adjusted so that each of the pixel unit reaches the full dark state.

In the step S02b, a voltage at the first electrode of each of the driving transistors T2 is obtained by a threshold obtaining device, as the threshold voltage of the driving transistor T2. The threshold voltages of the driving transistors in the pixel units are different from each other.

The process of obtaining the voltage at the first electrode of each driving transistor T2 may include: providing an on-signal for the control signal line Scan2 row by row, so that the detection transistors T3 turn on in unit of row. Upon the detection transistors T3 in a row turn on, the detection capacitors C on the detection signal line Sense corresponding to the row start to be charged. After the detection capacitors C being charged for a period of time, a voltage across each of detection capacitors C in the row is detected to obtain the voltage at the first electrode of each of the driving transistors T2 in this row.

In the step S03, a sum of the threshold voltage of the driving transistor T2 in each of the pixel units and the theoretical data voltage is calculated by a target data obtaining device, as a target data voltage of each of pixel units.

In the step S04, each of pixel units is provided with the corresponding target data voltage by a data driver, so that the display panel reaches the target brightness.

Until now, the compensation process is completed. Subsequently, the detection process is performed. The detection process specifically includes a step S11 and a step S12.

In the step S11, an actual value of an electric signal at the first electrode of the driving transistor T2 in each of the pixel units when the display panel reaches target brightness is detected by a detector. The detection process is the same as the process of the above step S02b of obtaining a voltage at the first electrode of the driving transistor T2 in each of the pixel units. That is, an on-signal is provided to the control signal line Scan2 row by row, and a voltage across each of the detection capacitors C connected to each of the detection signal lines Sense is detected.

In the step S12, it is determined by an analyzer, whether each of the pixel units is defective, according to the actual value of the electrical signal (i.e., a voltage at the first electrode of the driving transistor T2) corresponding to each of the pixel units.

Optionally, the step S12 may include a step S121a, a step S121b and a step S121c.

In step S121a, a difference between the standard value and the actual value of the electric signal corresponding to each of the pixel units is calculated by a calculating device, and the difference is the actual value minus the standard value.

In the step S121b, the difference corresponding to each of the pixel units is compared with a predetermined value by the comparator. When the difference is greater than the predetermined value, the pixel unit corresponding to the difference is determined as a defective pixel unit by a first determination device. A defect type of the defective pixel unit is determined according to a correspondence between each of the defect types and a respective one of difference ranges. For example, the predetermined value may be 1V, and the defect types may include: an short circuit inside the pixel circuit (the corresponding difference range is from 1V to 20V), an open circuit inside the pixel circuit (the corresponding difference range is from −10V to −1V). When the difference detected in the step S12 is between 1V and 20V, it is determined that the defect type of the pixel circuit is short circuit inside the pixel circuit (actually, when a short circuit occurs, the actual value of the voltage at the first electrode of the driving transistor T2 is large, and after the standard value is subtracted therefrom, the resultant actual value is still a larger value). When the difference detected in the step S12 is between −10V and −1V, it is determined that the defect type is open circuit inside the pixel circuit (in fact, when an open circuit occurs, the voltage at the first electrode of the driving transistor T2 is substantially zero, and after the standard value is subtracted therefrom, the resultant voltage is about the opposite value of the standard value.)

In step S121c, the number of pixel units belonging to each of the defect types is counted by a statistic calculator, and statistics result is output. In actual production, when the total number of defective pixel units or the number of pixel units belonging to a certain defect type is greater than a given value, the display panel is regarded as a defective product. The number of pixel units belonging to each of the defect types may be 0, 1, 2, or more. When the number of pixel units belonging to defect type A (e.g., short circuit) is 0, which means that no pixel unit has the defect type A. When the number of pixel units belonging to defect type B (e.g., open circuit) is 1, which means that only one pixel unit belongs to defect type B. Therefore, after performing the statistics in the step S121c, it is more convenient for an operator or a processor to further determine whether the display panel is a good product. This disclosure does not limit the output manner of the statistical result. For example, the statistical result may be outputted by being played in form of an audio, or the statistical result may be outputted by being displayed in form of an image.

Alternatively, the step S12 may include step a S122a, a step S122b and a step S122c.

In the step S122a, a reference image is generated by an image generator, the reference image includes a plurality of pixel points having a one-to-one correspondence to the pixel units of the display panel (i.e., each of the pixel points corresponds to a respective one of the pixel units), a grayscale of each pixel point is positive correlated with the actual value of the electrical signal at the first electrode of the driving transistor T2 in the respective one of the pixel units.

In the step S122b, a histogram normalization is performed on the reference image by an image processor.

In step S122c, it is determined, by a second determination device, whether each of the pixel units is defective, according to the histogram normalized reference image.

In normal pixel units and pixel units with various defect types, the voltages at the first electrodes of the driving transistors T2 are different from each other. In the normal pixel unit, the voltage at the first electrode of the driving transistor T2 is the same as or similar to the standard value; in the pixel unit in which the short circuit occurs, the voltage at the first electrode of the driving transistor T2 is relatively large; in the pixel unit in which the open circuit occurs, the voltage at the first electrode of the driving transistor T2 is about zero.

Since the grayscale of each pixel point in the reference image is positive correlated with the voltage at the first electrode of the driving transistor T2 in the respective one of the pixel units in display panel, that is, the larger the voltage at the first electrode of the driving transistor T2 in one of the pixel units in display panel is, the larger the grayscale of the respective pixel point in the generated reference image is. Therefore, whether a pixel unit is defective may be determined according to the grayscale of pixel point of the reference image corresponding to the pixel unit. In step S122b, the histogram normalized reference image may be displayed for the operator to observe so as to visually recognize the position of a defective pixel unit in the display panel and defect type thereof according to the grayscale (i.e., the degree of bright or dark) of each of the pixel points in the reference image.

The above step S12 includes two specific implementations (shown as the step S12a and the step S12b in FIG. 2). One or both of the implementations may be selectively executed.

Figure 3A:
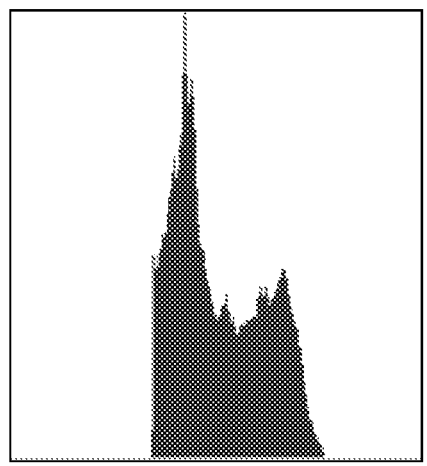
FIG. 3a is a histogram corresponding to a reference image prior to histogram normalization.
Figure 3B:
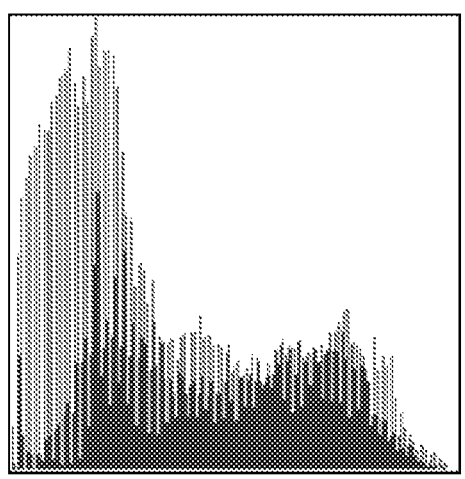
FIG. 3b is a histogram corresponding to a reference image after histogram normalization.

FIG. 3a is a histogram corresponding to a reference image before histogram normalization, and FIG. 3b is a histogram corresponding to a histogram normalized reference image, in each of which a horizontal axis is an actual value of the voltage signal at the first electrode of the driving transistor T2, and the vertical axis is the number of the pixel units. It may be seen from FIG. 3a and FIG. 3b that before the histogram normalization, the voltages at the first electrodes of all driving transistors T2 are in a relatively concentrated range, resulting in the contrast of the reference image being small and not easy to observe. After undergoing the histogram normalization, the contrast of the reference image is increased, and it is easier to observe the difference in grayscale between the pixel points each corresponding to one of the different defect types of pixel units, which facilitates to determine the position and defect type of each of defective pixel units in the display panel. Furthermore, the reference image may not be displayed. A processor with a data processing function can determine whether a pixel unit is defective according to the grayscale of the respective pixel point in the image.

Figure 4:
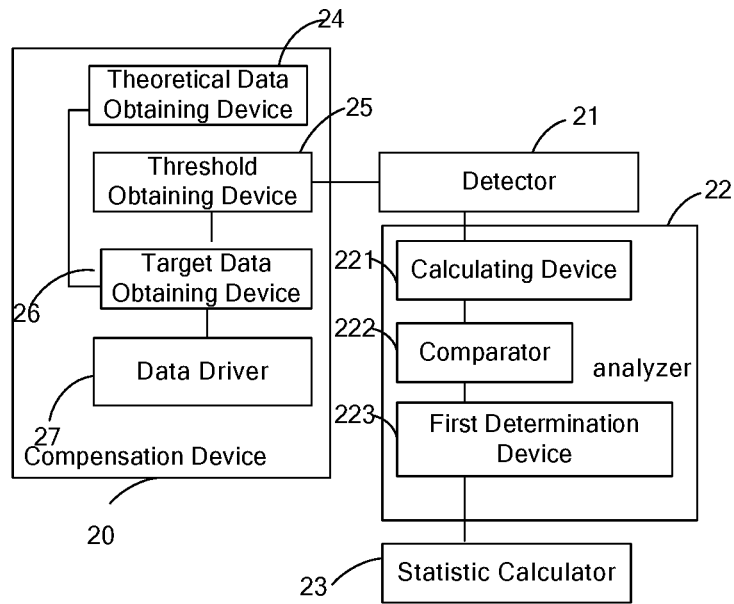
FIG. 4 is a structural schematic diagram of a detection device according to an embodiment of the present disclosure.

FIG. 4 is a structural schematic diagram of a detection device according to an embodiment of the present disclosure. As shown is FIG. 4, the detection device includes a detector 21 and an analyzer 22. The detector is configured to detect an actual value of an electrical signal at the first electrode of the driving transistor T2 in each pixel unit when the display panel reaches target brightness. The electrical signal includes a voltage signal and/or a current signal. The analyzer 22 is connected to the detector 21 and configured to determine whether a pixel unit is defective according to the actual value of the electrical signal corresponding to the pixel unit. As stated above, the electrical signal herein is a voltage signal at the first electrode of the driving transistor T2.

When the display panels are detected in batch by the detection device herein, the detector 21 detects the actual value of an electric signal at the first electrode of the driving transistor T2 in each of the pixel units, and the analyzer 22 determines, according to the actual value of the electrical signal corresponding to each of the pixel units, whether the respective one of the pixel units is defective, so as to eliminate the need for artificially analyzing a display image of the display panel, which improves detection efficiency and production yield.

As shown in FIG. 4, according to an embodiment, the analyzer 22 may include a calculating device 221, a comparator 222 and a first determination device 223. The calculating device 221 is connected to the detector 21 and configured to calculate the difference between the standard value and the actual value of the electric signal corresponding to each of the pixel units. The comparator 222 is connected to the calculating device 221 and configured to compare a predetermined value with the difference corresponding to each of the pixel units. The first determination device 223 is connected to the comparator 222, and configured to determine that the pixel unit corresponding to the difference is a defective pixel unit when the difference is greater than the predetermined value, and to determine a defect type of the defective pixel unit according to a correspondence between each of the defect types and a respective one of difference ranges. The analyzer 22 determines whether a pixel unit is defective according to the predetermined value and the difference corresponding to the pixel unit, and determines the defect type corresponding to a difference range that the difference belongs to, so as to determine quickly the defect the display panel has. Specifically, the standard value is an average value of actual values of electrical signals corresponding to the pixel units of the display panel.

In order to facilitate the operator to further determine the overall quality of the display panel, the detection device may further include a statistic calculator 23 connected to the analyzer 22 and configured to count the number of pixel units belonging to each of the defect types and to output statistics result. As a result, it is more convenient for the operator or other processors to further determine whether the display panel is a good product according to the number of defective pixel units. The statistic calculator 23 may be connected to an audio player (not shown) so that the statistical result may be outputted in form of audio; alternatively, the statistic calculator 23 may be connected to a display (not shown), so that the statistical result may be displayed on the display.

Figure 5:
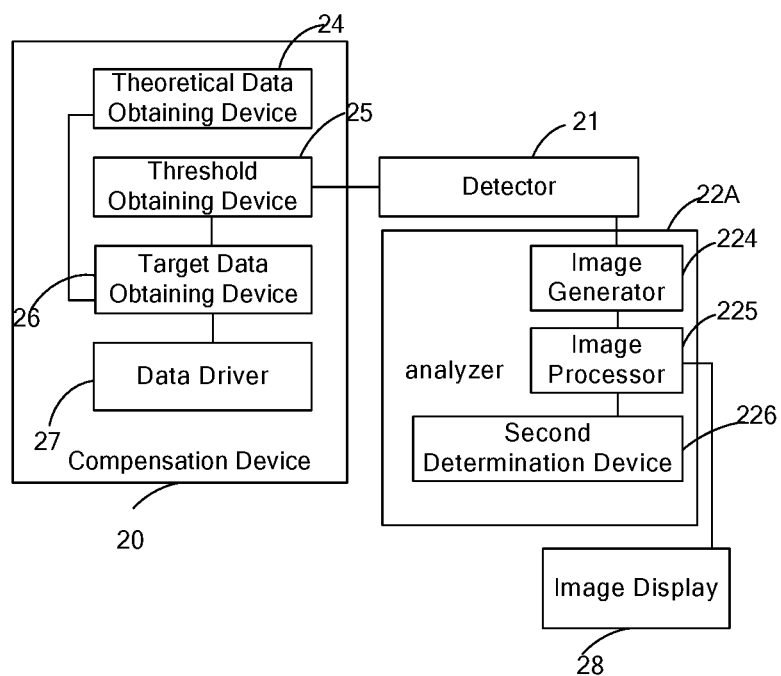
FIG. 5 is a structural schematic diagram of a detection device according to another embodiment of the present disclosure.

FIG. 5 is a structural schematic diagram of a detection device according to another embodiment of the present disclosure. As shown in FIG. 5, optionally, an analyzer 22A according to an embodiment may include an image generator 224, an image processor 225 and a second determination device 226.

The image generator 224 is connected to the detector 21 and configured to generate a reference image according to an actual value of an electric signal at the first electrode of the driving transistor T2 in each of the pixel units detected by the detector 21. The reference image includes a plurality of pixel points having a one-to-one correspondence to the pixel units in the display panel, and a grayscale of each pixel point is positive correlated with the actual value of the electrical signal at the first electrode of the driving transistor T2 in the respective one of the pixel units. The image processor 225 is connected to the image generator 224 and configured to perform a histogram normalization on the reference image. The second determination device 226 is connected to the image processor 225 and configured to determine whether each of the pixel units is defective according to the histogram normalized reference image.

In order to facilitate the operator to further determine the overall quality of the display panel and the position of each of defective pixel units directly and visually, the detection device may further include an image display 28. The image display 28 is configured to display the histogram normalized reference image.

It should be noted that either or both of the analyzers in the above embodiments may be used.

In the present disclosure, the analyzer 22 may be integrated into a processor of a computer, and the computer and the detector 21 are connected to each other through USB or network port transmission so that the analyzer 22 receives each of the values detected by the detector 21. It is understood that the analyzer 22 may perform numerical conversion on the received data so that a voltage value is convert into a digital signal, before performing the calculation. During the histogram normalization, the voltage range corresponding to the voltage at the first electrode of the driving transistors T2 is extended to a maximum numerical range, such as 0 to 1023, by the image processor 225. When the voltage range corresponding to the voltage at the first electrode of the driving transistor T2 is between 0V and 3V, each voltage in the voltage range is mapped to a numerical range of 0~1023.

In order to prevent different threshold voltages of different driving transistors T2 from affecting a detection result, each of the detection devices according to the embodiments of the present disclosure may further include a compensation device 20 for compensating the threshold voltage of each of the driving transistors T2.

The compensation device 20 may include a theoretical data obtaining device 24, a threshold obtaining device 25, a target data obtaining device 26 and a data driver 27.

The theoretical data obtaining device 24 obtains a theoretical data voltage according to the target brightness. Specifically, the theoretical data voltage obtaining device 24 may obtain a target grayscale according to the target brightness, and determine the theoretical data voltage corresponding to the target grayscale according to the correspondence between the grayscale and the data voltage.

The data driver 27 may provide an initial data voltage for pixel units of the display panel during threshold compensation, so that the display panel reaches a full dark state. The brightness of the display panel may be detected by a point type grayscale meter. The detector 21 may detect the voltage at the first electrode of the driving transistor T2 in each of the pixel units when the display panel reaches a full dark state. The data driver 27 may specifically include a data driving unit, a gate driving unit, and a timing control unit. In the threshold compensation stage, the timing control unit controls the gate driving unit to provide sequentially a scanning signal for the pixel units in unit of row. Upon a row is scanned, the data driving unit provides an initial data voltage to the pixel units in the scanned row. The process to make the display panel reach the full black state may be referenced to the step S02a described above, and details thereof are not described herein again.

The threshold obtaining device 25 is configured to obtain the threshold voltage of the driving transistor T2 in each of the pixel units. Specifically, the threshold obtaining device 25 may obtain the voltage, detected by the detector 21, at the first electrode of the driving transistor T2 in each of the pixel units when the display panel reaches the full dark state, as the threshold voltage of the driving transistor T2. The threshold voltages of the driving transistors T2 in the pixel units may be different from each other.

The target data obtaining device 26 is connected to the theoretical data obtaining device 24 and the threshold obtaining device 25, respectively, and the target data obtaining device 26 is configured to calculate a sum of the threshold voltage of the driving transistor T2 in each of pixel units and the theoretical data voltage, as a target data voltage corresponding to pixel unit.

The data driver 27 is connected to the target data obtaining device 26, and configured to provide each of the pixel units with the corresponding target data voltage, during the detection stage after the threshold compensation stage, so that the display panel reaches the target brightness. At this time, the detector 21 may detect the actual value of the electric signal (specifically, a voltage signal) at the first electrode of the driving transistor T2 in each of the pixel units in the display panel, and determine whether each of the pixel units is defective and the defect type of each of defective pixel units. The process for detecting the voltage may be referenced to the above step S11, and the details thereof will not be described again.

When a display panel is detected by the detection device, during threshold compensation, the theoretical data obtaining device 24 may obtain the theoretical data voltage according to the target brightness. The threshold obtaining device 25 may obtain the threshold voltage of the driving transistor T2 in each of the pixel units. The target data obtaining device 26 may obtain the target data voltage according to the threshold voltage and the theoretical data voltage. The data driver 27 may provide the target data voltage to the display panel. During detection, the detector 21 may detect the actual value of an electric signal at the first electrode of each of the driving transistors T2. The analyzer 22 may determine whether each of pixel units is defective according to the actual value of each of the electrical signals, and further determine the defect type of each of defective pixel units. The statistic calculator 23 may count the number of pixel units belonging to each of defect types and output statistics result. The image display 28 may display the reference image, so that an operator may visually observe the state of each of the pixel units in the display panel. The principle of the detection method has been described above, and is not described in detail again here.

It should be noted that, each of the elements shown in FIGS. 4 and 5 may be implemented by hardware, software, or a combination of hardware and software. In an embodiment, each of the elements shown in FIGS. 4 and 5 may be implemented by an integrated circuit (IC) having the corresponding function. In another embodiment, each of the elements shown in FIGS. 4 and 5 may be implemented by a computer and software stored in the memory of the computer, wherein a processor of the computer may execute the software to implement a function of each of the elements shown in FIGS. 4 and 5.

During the batch detection process in the present disclosure, it is possible to determine whether each pixel unit is defective by detecting an actual value of the electric signal at the first electrode of the driving transistor T2 in each of the pixel units and according to the actual value, so as to eliminate the need for artificially analyzing a display image of the display panel, which improves detection efficiency and production yield. Specifically, by obtaining the difference between the actual value and the standard value, and by determining the defect type corresponding to a difference range that the difference belongs to, it is possible to determine quickly the defect that the display panel has, to further determine the number of pixel units belonging to each of defect types, and to output statistics result. Alternatively, an reference image may be generated according to the actual value of the voltage at the first electrode of each of the driving transistors T2. Since the defect type of each pixel unit has a direct correlation with the actual value of the voltage at the first electrode of each of the driving transistors T2, therefore, the position and the defect type of the defective pixel unit may be visually observed by referring to the reference image.

It should be understood that the above implementations are merely exemplary embodiments for the purpose of illustrating the principles of the present disclosure, however, the present disclosure is not limited thereto. It will be apparent to those skilled in the art that various changes and modifications may be made without departing from the spirit and essence of the present disclosure, which are also to be regarded as falling within the scope of the present disclosure.

What is claimed is:

1. A detection method of a display panel, the display panel comprising a plurality of pixel units, each of the plurality of pixel units comprising a light emitting diode and a pixel circuit for driving the light emitting diode, the pixel circuit comprising a driving transistor with a first electrode of the driving transistor connected to the light emitting diode, the detection method comprising steps of:

detecting, by a detector, an actual value of an electric signal at the first electrode of the driving transistor in each of the plurality of pixel units when the display panel reaches target brightness, and determining, by an analyzer, according to the actual value of the electrical signal corresponding to each of the plurality of pixel units, whether each of the plurality of pixel units is defective, wherein before the step of detecting, by a detector, an actual value of an electric signal at the first electrode of the driving transistor in each of the plurality of pixel units when the display panel reaches target brightness, the detection method further comprises steps of:

obtaining, by a theoretical data obtaining device, a theoretical data voltage of each of the plurality of pixel units according to the target brightness;

obtaining, by a threshold obtaining device, a threshold voltage of the driving transistor in each of the plurality of pixel units;

calculating, by a target data obtaining device, a sum of the threshold voltage of the driving transistor in each of the plurality of pixel units and the theoretical data voltage of the pixel unit, as a target data voltage corresponding to the pixel unit; and providing, by a data driver, each of the plurality of pixel units with a respective target data voltage so that the display panel reaches the target brightness.

2. The detection method according to claim 1, wherein the analyzer comprises a calculating device, a comparator and a first determination device, and the step of determining, by an analyzer, according to the actual value of the electrical signal corresponding to each of the plurality of pixel units, whether each of the plurality of pixel units is defective comprises steps of:

calculating, by the calculating device, a difference between a standard value and the actual value of the electric signal corresponding to each of the plurality of pixel units;

comparing, by the comparator, a predetermined value with the difference corresponding to each of the plurality of pixel units; and determining, by the first determination device, a pixel unit corresponding to the difference as a defective pixel unit when the difference is greater than the predetermined value, and determining a defect type of the defective pixel unit according to a correspondence between each of a plurality of defect types and a respective one of difference ranges.

3. The detection method according to claim 2, wherein the standard value is an average value of the actual values of the electrical signals corresponding to the plurality of pixel units of the display panel.

4. The detection method according to claim 2, wherein after the step of determining, by the first determination device, a pixel unit corresponding to the difference as a defective pixel unit when the difference is greater than the predetermined value, and determining a defect type of the defective pixel unit according to a correspondence between each of the plurality of defect types and a respective one of difference ranges, the detection method further comprises:

counting a number of pixel units belonging to each of the plurality of defect types by a statistic calculator, and outputting statistics result.

5. The detection method according to claim 1, wherein the analyzer comprises an image generator, an image processor, and a second determination device, and the step of determining, by an analyzer, according to the actual value of the electrical signal corresponding to each of the plurality of pixel units, whether each of the plurality of pixel units is defective comprises steps of:

generating a reference image by the image generator, the reference image comprising a plurality of pixel points having a one-to-one correspondence to the plurality of pixel units of the display panel, a grayscale of each of the plurality of pixel points being positive correlated with the actual value of the electrical signal at the first electrode of the driving transistor in the respective one of the plurality of pixel units;

performing histogram normalization on the reference image by the image processor; and determining, by the second determination device, whether each of the plurality of pixel units is defective according to a histogram normalized reference image.

6. The detection method according to claim 1, wherein the step of obtaining, by a theoretical data obtaining device, a theoretical data voltage of each of the plurality of pixel units according to the target brightness comprises:

obtaining, by the theoretical data obtaining device, a target grayscale according to the target brightness; and determining the theoretical data voltage corresponding to the target grayscale according to a correspondence between a grayscale and a data voltage.

7. The detection method according to claim 1, wherein the step of obtaining, by a threshold obtaining device, a threshold voltage of the driving transistor in each of the plurality of pixel units comprises:

providing, by the data driver, an initial data voltage to the plurality of pixel units of the display panel so that the display panel reaches a full dark state; and obtaining, by the threshold value obtaining device, a voltage at the first electrode of the driving transistor in each of the plurality of pixel units as the threshold voltage of the driving transistor.

8. The detection method according to claim 7, wherein each of the plurality of pixel units further comprises a detection transistor and a detection capacitor, and a first electrode of the detection transistor is connected to the first electrode of the driving transistor, a control electrode of the detection transistor is connected to a control signal line, a second electrode of the detection transistor is connected to a first terminal of the detection capacitor, and a second terminal of the detection capacitor is connected to a detection signal line, and wherein when the display panel reaches the full dark state, the detection transistor is turned on under the control of the control signal line, and the detector detects a voltage across the detection capacitor as the threshold voltage of the driving transistor.

9. The detection method according to claim 1, wherein each of the plurality of pixel units further comprises a detection transistor and a detection capacitor, and a first electrode of the detection transistor is connected to the first electrode of the driving transistor, a control electrode of the detection transistor is connected to a control signal line, a second electrode of the detection transistor is connected to a first terminal of the detection capacitor, and a second terminal of the detection capacitor is connected to a detection signal line, and wherein when the display panel reaches the target brightness, the detection transistor is turned on under the control of the control signal line, and the detector detects a voltage across the detection capacitor as the actual value of the electrical signal at the first electrode of the driving transistor.

10. A detection device of a display panel, the display panel comprising a plurality of pixel units, each of the plurality of pixel units comprising a light emitting diode and a pixel circuit for driving the light emitting diode, the pixel circuit comprising a driving transistor with a first electrode of the driving transistor connected to the light emitting diode, the detection device comprising:
 a detector, configured to detect an actual value of an electric signal at the first electrode of the driving transistor in each of the plurality of pixel units when the display panel reaches target brightness, and
 an analyzer, configured to determine, according to the actual value of the electrical signal corresponding to each of the plurality of pixel units, whether each of the plurality of pixel units is defective,
 wherein the detection device further comprises:
 a theoretical data obtaining device, configured to obtain a theoretical data voltage of each of the plurality of pixel units according to the target brightness;
 a threshold obtaining device, configured to obtain a threshold voltage of the driving transistor in each of the plurality of pixel units;
 a target data obtaining device, configured to calculate a sum of the threshold voltage of the driving transistor in each of the plurality of pixel units and the theoretical data voltage of the pixel unit, as a target data voltage of the pixel unit; and
 a data driver, configured to provide each of the plurality of pixel units with a respective target data voltage so that the display panel reaches the target brightness.

11. The detection device according to claim 10, wherein the analyzer comprises:
 a calculating device, configured to calculate a difference between a standard value and the actual value of the electric signal corresponding to each of the plurality of pixel units;
 a comparator, configured to compare a predetermined value with the difference corresponding to each of the plurality of pixel units; and
 a first determination device, configured to determine a pixel unit corresponding to the difference as a defective pixel unit when the difference is greater than the predetermined value, and to determine a defect type of the defective pixel unit according to a correspondence between each of a plurality of defect types and a respective one of difference ranges.

12. The detection device according to claim 11, wherein the standard value is an average value of the actual values of the electrical signals corresponding to the plurality of pixel units of the display panel.

13. The detection device according to claim 11, wherein the detection device further comprises:
 a statistic calculator, configured to count a number of pixel units belonging to each of the plurality of defect types according to determination result of the analyzer, and to output statistics result.

14. The detection device according to claim 11, wherein each of the plurality of pixel units further comprises a detection transistor and a detection capacitor, and a first electrode of the detection transistor is connected to the first electrode of the driving transistor, a control electrode of the detection transistor is connected to a control signal line, a second electrode of the detection transistor is connected to a first terminal of the detection capacitor, and a second terminal of the detection capacitor is connected to a detection signal line, and wherein when the display panel reaches the target brightness, the detection transistor is turned on under the control of the control signal line, and the detector detects a voltage across the detection capacitor as the actual value of the electrical signal at the first electrode of the driving transistor.

15. The detection device according to claim 10, wherein the analyzer comprises:
 an image generator, configured to generate a reference image, the reference image comprising a plurality of pixel points having a one-to-one correspondence to the plurality of pixel units of the display panel, a grayscale of each of the plurality of pixel points being positive correlated with the actual value of the electrical signal at the first electrode of the driving transistor in the respective one of the plurality of pixel units;
 an image processor, configured to perform a histogram normalization on the reference image; and
 a second determination device, configured to determine whether each of the plurality of pixel units is defective according to a histogram normalized reference image.

16. The detection device according to claim 10, wherein the theoretical data obtaining device is configured to obtain a target grayscale according to the target brightness; and to determine the theoretical data voltage corresponding to the target grayscale according to a correspondence between a grayscale and a data voltage.

17. The detection device according to claim 10, wherein
 the data driver is configured to provide an initial data voltage to the plurality of pixel units of the display panel so that the display panel reaches a full dark state;
 the detector is configured to detect a voltage at the first electrode of the driving transistor in each of the plurality of pixel units when the display panel reaches the full dark state; and
 the threshold value obtaining device is configured to obtain the voltage at the first electrode of the driving transistor in each of the plurality of pixel units when the display panel reaches the full dark state, as the threshold voltage of the driving transistor.

18. The detection device according to claim 17, wherein each of the plurality of pixel units further comprises a detection transistor and a detection capacitor, and a first electrode of the detection transistor is connected to the first electrode of the driving transistor, a control electrode of the detection transistor is connected to a control signal line, a second electrode of the detection transistor is connected to a first terminal of the detection capacitor, and a second terminal of the detection capacitor is connected to a detection signal line, and wherein when the display panel reaches the full dark state, the detection transistor is turned on under the control of the control signal line, and the detector detects a voltage across the detection capacitor as the threshold voltage of the driving transistor.

* * * * *